United States Patent
Delalleau et al.

(10) Patent No.: US 11,424,342 B2
(45) Date of Patent: Aug. 23, 2022

(54) FABRICATION PROCESS COMPRISING AN OPERATION OF DEFINING AN EFFECTIVE CHANNEL LENGTH FOR MOSFET TRANSISTORS

(71) Applicant: STMicroelectronics (Rousset) SAS, Rousset (FR)

(72) Inventors: Julien Delalleau, Marseilles (FR); Franck Julien, La Penne sur Huveaune (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 16 days.

(21) Appl. No.: 16/939,767

(22) Filed: Jul. 27, 2020

(65) Prior Publication Data

US 2021/0036126 A1    Feb. 4, 2021

(51) Int. Cl.
| | | |
|---|---|---|
| *H01L 21/00* | (2006.01) | |
| *H01L 29/66* | (2006.01) | |
| *H01L 21/027* | (2006.01) | |
| *H01L 21/8234* | (2006.01) | |
| *H01L 29/10* | (2006.01) | |
| *H01L 29/78* | (2006.01) | |

(52) U.S. Cl.
CPC ........ *H01L 29/6659* (2013.01); *H01L 21/027* (2013.01); *H01L 21/823412* (2013.01); *H01L 29/1037* (2013.01); *H01L 29/66583* (2013.01); *H01L 29/7834* (2013.01)

(58) Field of Classification Search
CPC ............. H01L 29/6659; H01L 21/027; H01L 21/823412; H01L 29/1037; H01L 29/66583; H01L 29/7834
See application file for complete search history.

(56) References Cited

U.S. PATENT DOCUMENTS

| | | | |
|---|---|---|---|
| 6,033,963 A | 3/2000 | Huang et al. | |
| 2003/0109089 A1 | 6/2003 | Mitros et al. | |
| 2008/0070391 A1* | 3/2008 | Dokumaci | ........ H01L 21/26586 438/525 |
| 2012/0117519 A1 | 5/2012 | Parikh | |
| 2012/0264263 A1 | 10/2012 | Bulucea et al. | |

(Continued)

FOREIGN PATENT DOCUMENTS

JP    2010080970 A    4/2010

OTHER PUBLICATIONS

EP Search Report and Written Opinion for co-pending EP Appl. No. 20186529.2 dated Nov. 12, 2020 (11 pages).

(Continued)

*Primary Examiner* — Richard A Booth
(74) *Attorney, Agent, or Firm* — Crowe & Dunlevy

(57) ABSTRACT

In fabricating metal-oxide-semiconductor field-effect transistors (MOSFETs), the implanting of lightly doped drain regions is performed before forming gate regions with a physical gate length that is associated with a reference channel length. The step of implanting lightly doped drain regions includes forming an implantation mask defining the lightly doped drain regions and an effective channel length of each MOSFET. The forming of the implantation mask is configured to define an effective channel length of at least one MOSFET that is different from the respective reference channel length.

20 Claims, 6 Drawing Sheets

(56) References Cited

U.S. PATENT DOCUMENTS

| | | | |
|---|---|---|---|
| 2013/0295730 A1* | 11/2013 | Adam | H01L 27/1203 |
| | | | 438/151 |
| 2014/0091397 A1 | 4/2014 | Ema et al. | |
| 2014/0117421 A1 | 5/2014 | Seo et al. | |
| 2017/0200650 A1 | 7/2017 | Chang et al. | |
| 2021/0036126 A1* | 2/2021 | Delalleau | H01L 27/088 |

OTHER PUBLICATIONS

INPI Search Report and Written Opinion for FR 1908778 dated Mar. 17, 2020 (11 pages).

\* cited by examiner

FABRICATION PROCESS COMPRISING AN OPERATION OF DEFINING AN EFFECTIVE CHANNEL LENGTH FOR MOSFET TRANSISTORS

PRIORITY CLAIM

This application claims the priority benefit of French Application for Patent No. 1908778, filed on Jul. 31, 2019, the content of which is hereby incorporated by reference in its entirety to the maximum extent allowable by law.

TECHNICAL FIELD

Implementations relate to the processes for fabricating integrated circuits and, in particular, to the operation for defining an effective channel length in the fabrication of metal-oxide-semiconductor field-effect transistors (MOSFETs).

BACKGROUND

The fabrication of metal-oxide-semiconductor field-effect transistors (MOSFETs) typically comprises a step of forming a gate region and a step of implanting lightly doped drain (LDD) regions.

Typically, the operation of forming the gate region for MOSFETs comprises an operation of forming a conductive polycrystalline silicon layer and an operation of lithographically etching the polycrystalline silicon layer using a mask. The lithographic etching of the gate regions is typically a critical step in the process, in particular in the alignment of the mask and the precision, selectivity and complexity of the etching chemistry, thus the cost of forming the gate regions is very high.

The operation of implanting the lightly doped drain regions typically comprises an implantation operation that is self-aligned with the gate region, where the gate region acts as a mask that defines the implanted regions.

As such, the effective channel length, i.e. the distance between the two lightly doped drain regions below the gate, is determined by the alignment of the implanted zones with the geometry of the gate region (taking into account in particular the diffusion of the dopants).

However, the effective channel length determines critical characteristics of MOSFETs such as threshold voltage, leakage current or the breakdown voltage of the transistors.

It would be desirable to be able to adjust the processes for fabricating integrated circuits so as to modify the characteristics of MOSFETs at lower cost.

SUMMARY

To this end, what is proposed according to one aspect is a process for fabricating metal-oxide-semiconductor field-effect transistors (MOSFETs), comprising a first step of implanting lightly doped regions on either side of the site for future gate regions and a second step of forming the gate regions with a physical gate length that is associated with a reference channel length. The first step is carried out before the second step, and the first step comprises an operation of forming an implantation mask defining the lightly doped regions and an effective channel length of each MOSFET, the operation of forming the implantation mask being configured to define an effective channel length of at least one MOSFET that is different from the respective reference channel length.

The lightly doped regions on either side of the gate region are commonly referred to as lightly doped drain regions regardless of the side of the gate region that actually accommodates the source region or the drain region.

Thus, the implantation mask is not dependent on the gate region and the effective channel length of each MOSFET is no longer dependent on the physical gate length of the transistor. As such, it is possible to vary the effective channel length without modifying the step of forming the gate regions, which is typically the most expensive step. Integrated circuits of the same design may then exhibit different configurations, for example one being fast and another exhibiting low consumption, or else be corrected or adjusted at lower cost. The cost decrease may also facilitate the fabrication of experimental products.

According to one implementation, the operation of forming the implantation mask is configured to define the effective channel length of at least one first MOSFET to be shorter than the respective reference channel length.

This makes it possible, in particular, to decrease the threshold voltage of the MOSFET, for example for producing fast transistors.

According to one implementation, the operation of forming the implantation mask is configured to define the effective channel length of at least one second MOSFET to be longer than the respective reference channel length.

This makes it possible, in particular, to decrease the leakage currents of the MOSFET, for example for producing an integrated circuit exhibiting low consumption.

According to one implementation, the operation of forming the implantation mask is configured to define the effective channel length of at least one third MOSFET to be zero or short enough that the third MOSFET is always on.

According to one implementation, the operation of forming the implantation mask is configured to define the effective channel length of at least one fourth MOSFET to be long enough that the fourth MOSFET is always off.

Of course, the terms "always on" and "always off" should be understood relative to the conditions of use for which the third and fourth transistor are intended.

These implementations are, for example, applicable to embodiments of decoys against reverse engineering.

Advantageously, when the fabrication of the MOSFETs further comprises an operation of forming dielectric spacer regions on the flanks of the gate regions, the operation of forming the implantation mask may be configured to define the effective channel length of said at least one fourth MOSFET to be delimited to below the spacer regions.

In other words, the ends of the channel region, the effective length of which is long enough to confer always-off behavior, are hidden below the spacer regions and below the gate region. Thus, the effective channel length is more difficult to measure and this forms an additional means against reverse engineering.

According to one implementation in which the fabrication of the MOSFETs further comprises an operation of forming at least one lateral isolating region in contact with the channel region of at least one fifth MOSFET, the operation of forming the implantation mask is configured to define the effective channel length of said at least one fifth MOSFET so as to compensate for a variation in its characteristics due to parasitic edge effects with the lateral isolating region.

Typically, the lateral isolating regions are produced using a shallow-trench-isolation (STI) or a local-oxidation-of-silicon (LOCOS) process.

Parasitic edge effects, usually referred to as hump effects, may deform the desired characteristics, which are for example determined by the reference channel length that is associated with the physical gate length. The process according to this implementation may thus compensate for such deformation.

According to one implementation, said MOSFETs are fabricated on a semiconductor wafer, and the operation of forming the implantation mask is configured to define the effective channel length of the MOSFETs so as to compensate for a variation in the characteristics of the MOSFETs that is correlated with the position of each MOSFET on the wafer.

The process according to this implementation thus makes it possible to compensate for unwanted scatter in the characteristics of the transistors, which is dependent on the position of the circuit on the wafer.

According to one implementation, the implantation mask is formed using resist and photolithography.

The steps of forming a resist mask are typically much less expensive than the operation of forming the gate regions, and this implementation allows the costs of the process to be limited.

According to one alternative, the implantation mask is a hardmask.

This alternative may be advantageous in particular in the case that the hard mask is also already present in the overall process for fabricating the integrated circuit.

According to another aspect, a semiconductor device, for example a silicon wafer or an integrated-circuit chip, is also proposed, which device comprises at least one first transistor and at least one second transistor, said at least one first transistor and said at least one second transistor each including a gate region with a gate length that is associated with a reference channel length, and a channel region with an effective channel length, wherein the gate lengths of said at least one first transistor and said at least one second transistor are all equal, and the effective channel lengths of said at least one first transistor and of said at least one second transistor are different.

For example, the effective channel lengths of said at least one first transistor and said at least one second transistor are distinctly configured:
  to be equal to the reference channel length; or
  to be short enough that the transistor is always on; or
  to be long enough that the transistor is always off; or
  to compensate for a variation in the characteristics of the transistor due to parasitic edge effects with a lateral isolating region in contact with the channel region of the transistor; or
  to compensate for a variation in the characteristics of the transistor that is correlated with the position of the transistor on a semiconductor wafer incorporating the semiconductor device.

BRIEF DESCRIPTION OF THE DRAWINGS

Other advantages and features of the invention will become apparent on examining the detailed description of completely non-limiting implementations and the appended drawings, in which.

DETAILED DESCRIPTION

Figure 1A:
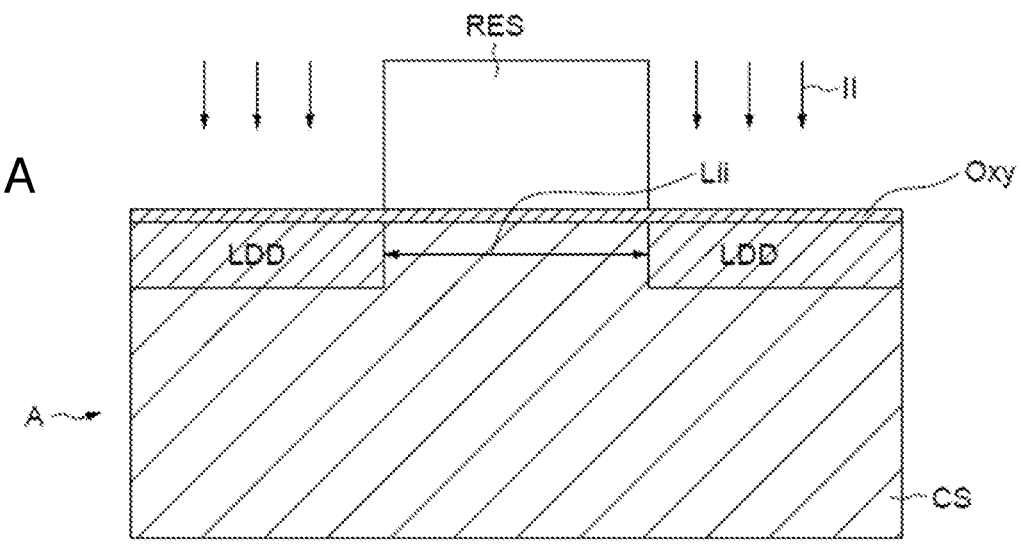
FIGS. 1A-1C show an exemplary implementation of a process for fabricating a MOSFET.
Figure 1B:
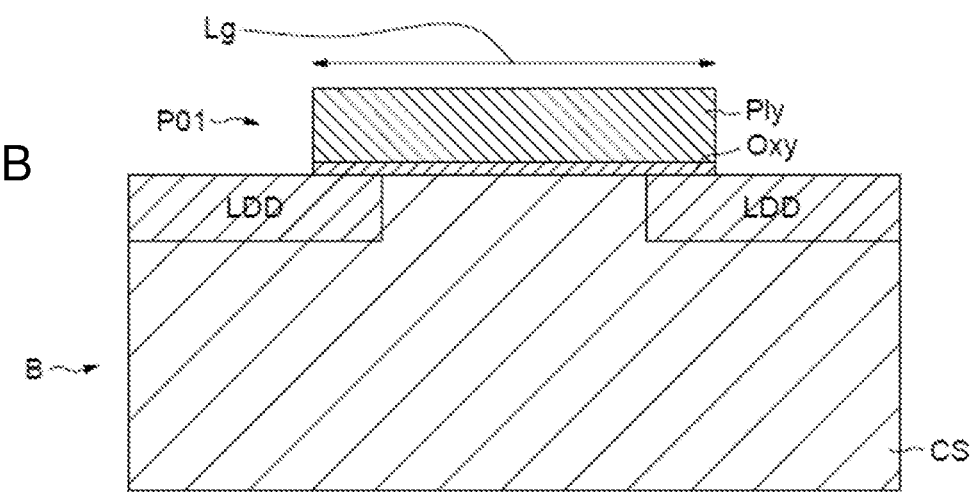
Figure 1C:
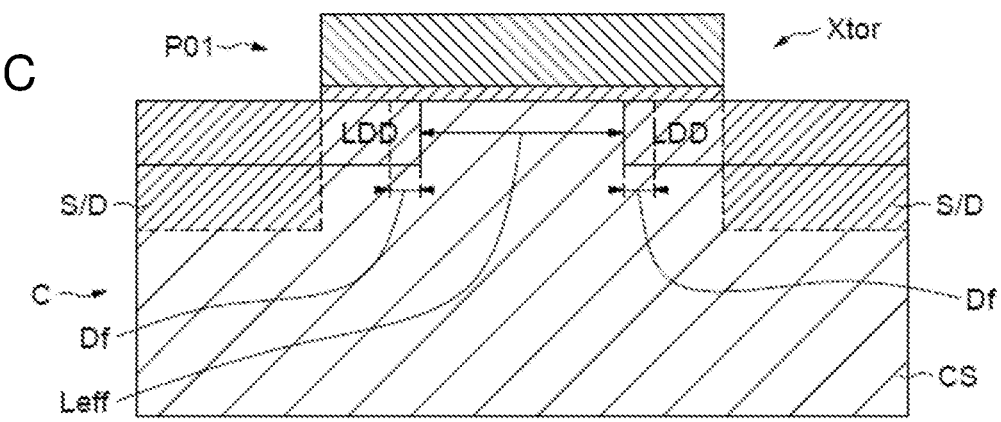

FIGS. 1a-1C show an exemplary implementation of a process for fabricating a MOSFET, denoted by Xtor, i.e. a metal-oxide-semiconductor field-effect transistor.

The operation of fabricating the MOSFET comprises a first step shown in FIG. 1A of implanting lightly doped regions LDD on either side of a future gate region PO1, carried out before a second step shown in FIG. 1B of forming the gate region PO1. The transistor Xtor is formed with an effective channel length Leff after completion of a step shown in FIG. 1C of diffusing Df and of implanting conduction regions S/D.

The lightly doped regions on either side of the gate region are configured to form regions that are typically referred to as lightly doped drain regions.

The lightly doped drain regions LDD are used to widen the depletion zone at the drain-channel junction so as to decrease the electric field there in order to avoid hot-electron injection effects. To simplify the process, the source-region sides are also implanted with lightly doped drain regions LDD.

The step shown in FIG. 1A of implanting the lightly doped drain regions LDD comprises an operation of forming an implantation mask RES defining the regions of a semiconductor well CS that are exposed to the implantation II of dopant ionic particles.

The well CS may be of any type, for example a high-voltage or low-voltage well exhibiting p- or n-type conductivity, and possibly be a native well, i.e. the semiconductor substrate itself.

In the example shown, the well CS includes a dielectric layer Oxy on its surface, below the mask and during the implantation II of the step shown by FIG. 1A.

The implantation mask RES thus makes it possible to define the length Lii separating the lightly doped drain regions LDD at the time of implantation II and, at the end of the step shown in FIG. 1C, an effective channel length Leff of the MOSFET Xtor.

In other words, the implantation mask RES is configured to define the effective channel length Leff of the transistor Xtor, while of course taking the diffusion of the dopants into account.

For example, the implantation mask RES is formed using photoresist via photolithography.

As an alternative, the implantation mask RES is a hardmask, for example made of dielectric material, deposited beforehand then etched according to the desired model. This alternative is advantageous if there is to be a step prior to the operation of forming the gate which comprises the deposition and etching of hardmask materials.

The hardmask could also be formed by preliminarily forming a gate material defining said effective channel length Leff. The operation of forming the gate regions, described below with reference to the step shown in FIG. 1B, then comprises completing said preliminary formation operation after the implantation operation, to form the gate regions at said fixed physical gate length. For example, preliminarily forming an undersized gate region makes it possible to define a shorter effective channel length, and will subsequently be completed by means of a new operation of forming gate material and of etching to the desired physical gate length. Conversely, preliminarily forming an oversized gate region makes it possible to define a longer effective channel length, and will subsequently be completed by means of an operation of etching to the desired physical gate length. As such, this alternative is advantageous if preliminary deposition and etching steps, and new formations for completing the gate regions, are also planned in the fabrication process.

The step shown in FIG. 1B comprises an operation of forming the gate region PO1. The gate region comprises a dielectric layer Oxy, for example a silicon oxide layer, and comprises a conductive layer Ply, for example a conductive doped polycrystalline silicon bar. The gate region PO1, although actually having a dielectric-polycrystalline silicon structure, is typically referred to as having a metal-oxide-semiconductor structure for historical reasons. The physical length Lg of the gate region is thus defined in the step shown by FIG. 1B by a typically precise and expensive etching operation.

Specifically, the lithographic etching of the gate regions is typically a critical step in processes for fabricating MOSFETs, in particular in terms of mask alignment, and in terms of the precision, selectivity and complexity of the etching chemistry, which represents a substantial expense.

For example, the cost of forming the gate regions may be up to 10 times the cost of forming the mask RES in the step shown by FIG. 1A.

The step shown by FIG. 1C shows, in a simplified manner, the finishing of the process for fabricating the MOSFET Xtor, comprising diffusion Df of the lightly doped drain regions LDD and an operation of forming conduction regions S/D, i.e. the source and the drain, of the transistor Xtor.

Thus, the implantation mask RES is configured to define the effective channel length Leff of the transistor Xtor, while taking the diffusion Df of the lightly doped drain regions into account. The effective channel length Leff is therefore defined independently of the gate region PO1 and of its geometry.

In conventional fabrication processes, the lightly doped drain regions are implanted after the operation of forming the gate region, and the gate region PO1 is used as a hardmask that defines the self-aligned position of the lightly doped drain regions LDD. Thus, in conventional processes, it is the physical length of the gate region Lg that defines the distance between the two lightly doped drain regions LDD. Consequently and in particular, in conventional processes, it is the physical gate length Lg that defines the effective channel length Leff of the transistor Xtor.

However, in the fabrication process of FIGS. 1A-1C, the effective channel length Leff is independent of the physical length Lg of the gate region PO1. The effective channel length Leff may thus be configured so as to differ from a reference channel length such as would be defined by a conventional implantation operation that is self-aligned to the gate region PO1.

Conventionally and as known per se, the effective channel length Leff parameterizes a number of characteristics of a MOSFET embodiment. In particular, the threshold voltage, the breakdown voltage, the leakage current and the saturation current of a transistor are characteristics that are parameterized by the effective channel length Leff.

Figure 2:
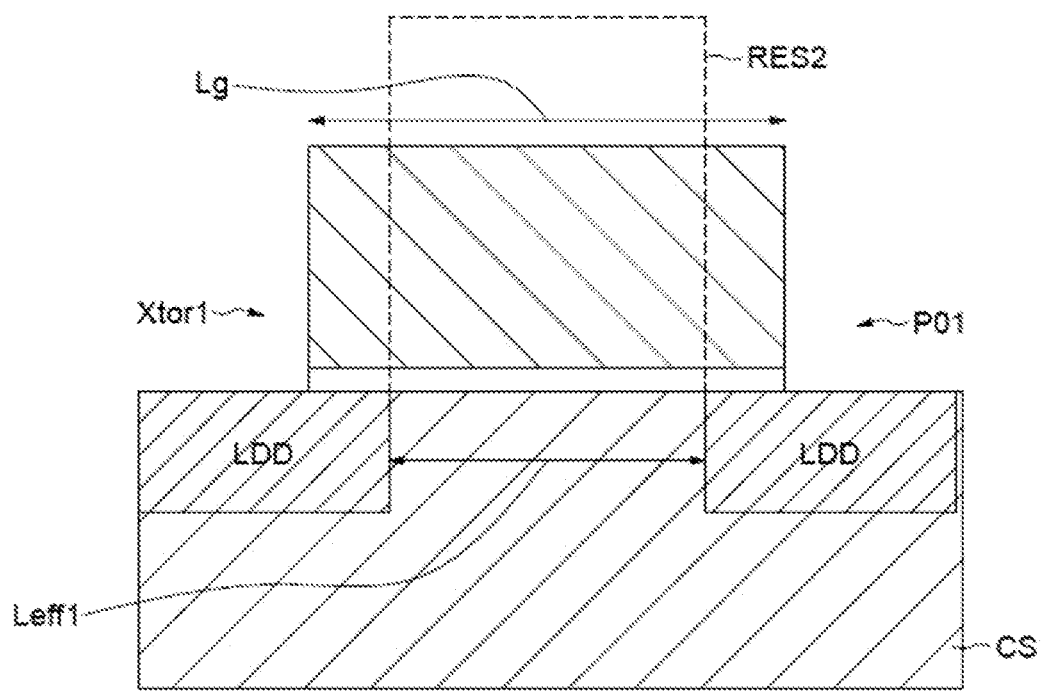
FIGS. 2 and 3 illustrate examples in which the implantation masks are configured to define effective channel lengths.
Figure 3:
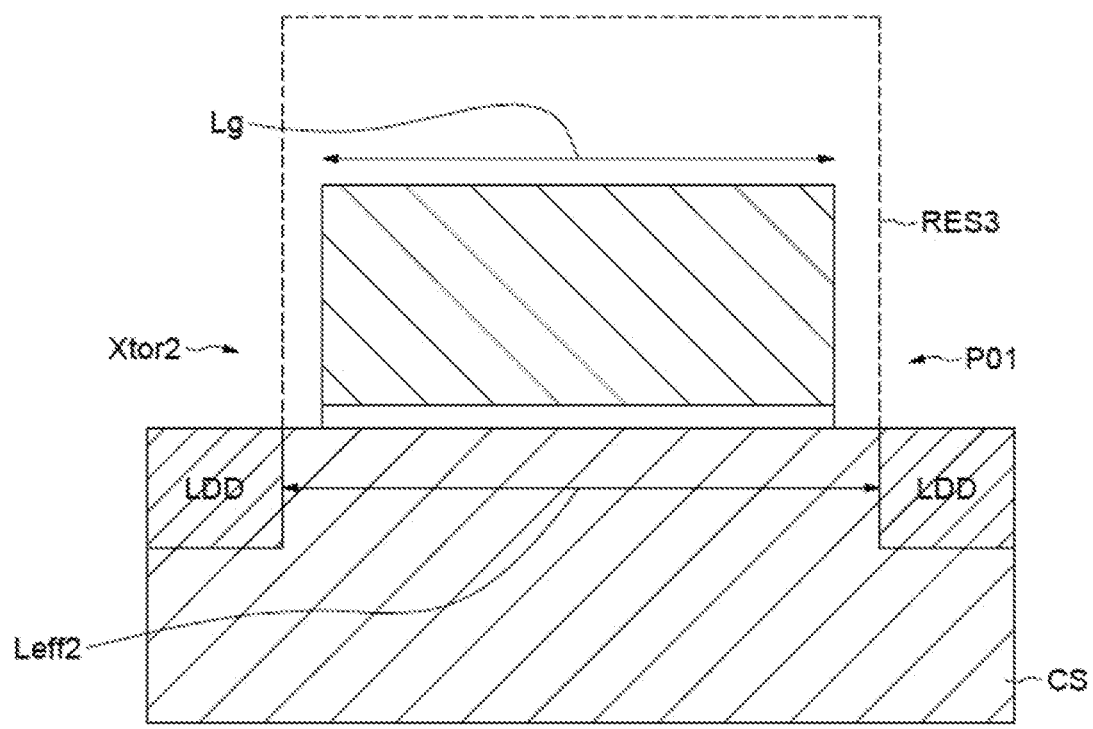

FIGS. 2 and 3 illustrate examples in which the implantation masks RES1, RES2 are configured to define the effective channel lengths Leff1, Leff2 of transistors Xtor1, Xtor2 that differ from a reference channel length Lg.

For simplicity, the diffusion of dopants in the implanted regions is not shown in FIGS. 2 and 3, and the effective channel length is then aligned with the formation of the respective masks RES2, RES3, the reference channel length then being similar to the physical gate length Lg. Of course, in practice, diffusion of the lightly doped drain regions LDD into the wells CS will be duly taken into account both for consideration of the effective channel length and for consideration of the reference channel length.

In the example of FIG. 2, the implantation mask RES2 is configured to define the effective channel length Leff1 of a first MOSFET Xtor1 to be shorter than the reference channel length Lg.

In the example of FIG. 3, the implantation mask RES3 is configured to define the effective channel length Leff2 of a second transistor Xtor2 to be longer than the reference channel length Lg.

Figure 4:
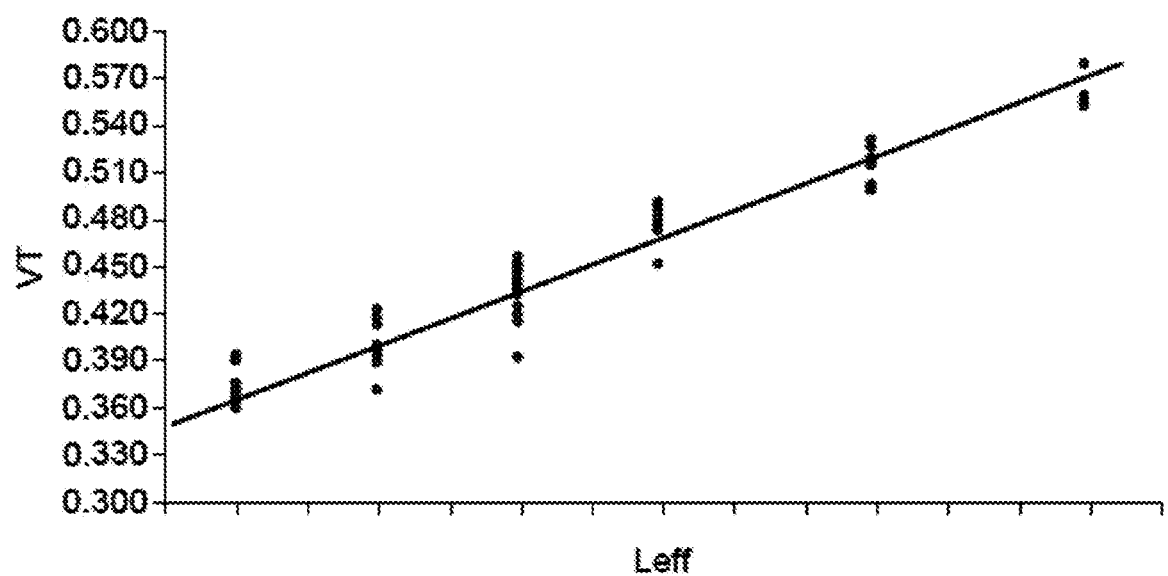
FIG. 4 is a graph illustrating threshold voltage according to the effective channel length of identical MOSFETs having the same physical gate length but different effective channel lengths.

FIG. 4 shows results of measurements of the threshold voltage VT according to the effective channel length Leff of various embodiments of identical MOSFETs, with in particular the same physical gate length Lg, but for which the operation of forming the implantation mask has been configured to define different effective channel lengths Leff. These measurements demonstrate that there is a positive linear relationship between the effective channel length Leff and the resulting threshold voltage VT over a range of effective lengths.

Figure 5:
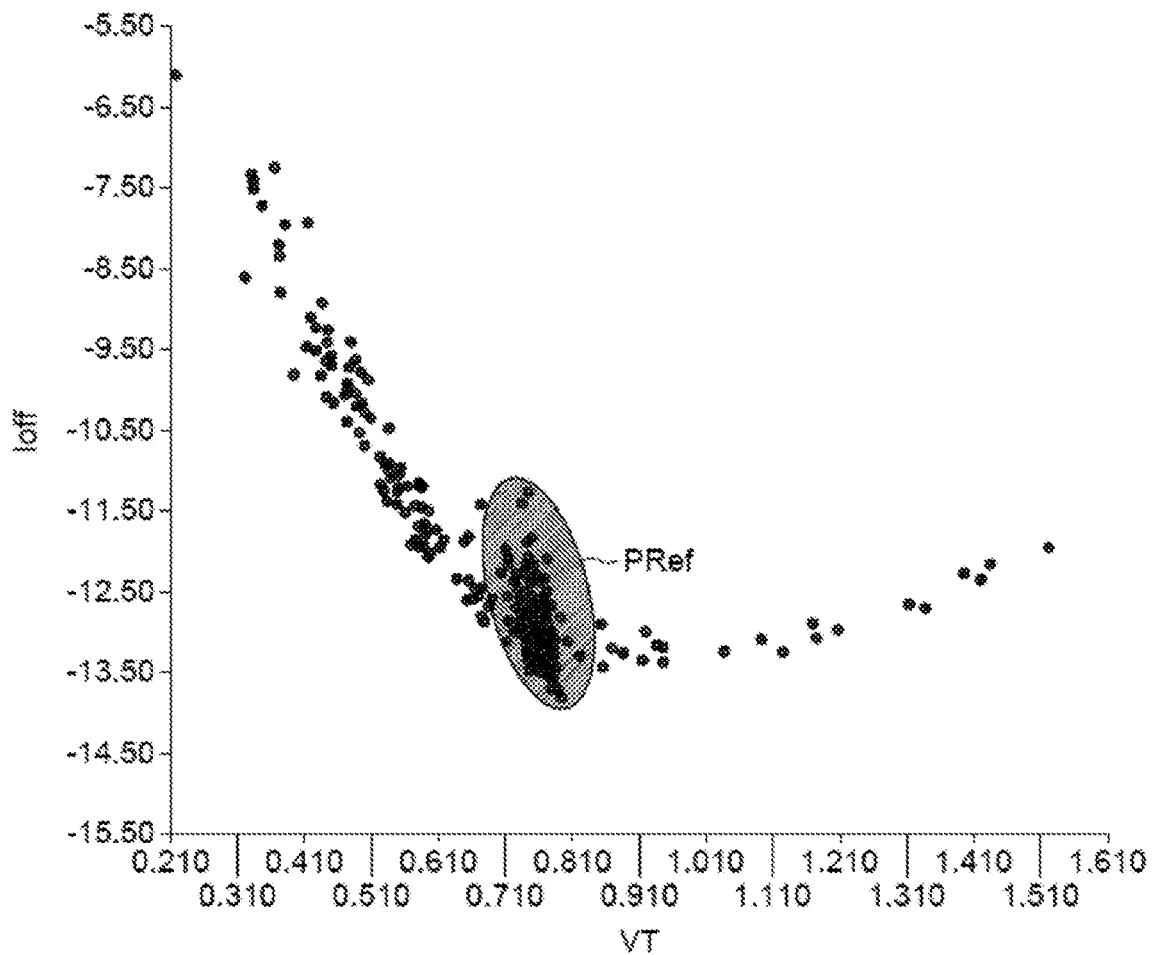
FIG. 5 is a scatter graph illustrating threshold voltage and leakage current of identical MOSFETs having the same physical gate length but effective channel lengths Leff that differ from FIG. 4.

FIG. 5 shows results of measurements of the threshold voltage VT and of the leakage current Ioff of various embodiments of identical MOSFETs, with in particular the same physical gate length Lg, but for which the operation of forming the implantation mask has been configured to define effective channel lengths Leff that differ from FIG. 4.

FIG. 5 is a scatter graph, the coordinates of which are the measured threshold voltage VT on the horizontal axis and the measured leakage current Ioff on the vertical axis, for each embodiment.

A reference population PRef corresponds to measurements taken from conventionally embodied transistors, with the effective channel length being the reference channel length defined by the physical gate length Lg.

With respect the reference population PRef, when the threshold voltage VT is decreased, the leakage current Ioff increases.

When the threshold voltage VT is increased, the leakage current Ioff remains stable, albeit with a slight increase.

Thus, it possible to modulate the threshold voltage VT and the leakage current Ioff of an embodiment of a transistor with a given physical gate length.

Thus, in a fabrication process providing a plurality of embodiments of transistors that are theoretically identical with the same physical gate length Lg, it is possible to impart a different tendency to the characteristics of at least one transistor, and to compensate for unwanted scatter in the desired characteristics of at least one transistor.

The tendencies imparted to the characteristics of said at least one transistor may for example to be faster or to consume less energy.

For example, referring back to FIG. 2, the effective channel length Leff is shorter than the reference channel length Lg, and the threshold voltage VT of this first transistor is lower and a tendency to be faster has been imparted to the first transistor Xtor1.

Conversely, referring now FIG. 3, the effective channel length Leff is longer than the reference channel length Lg, leakage currents are limited, and thus a tendency to consume less energy has been imparted to this second transistor Xtor2.

Furthermore, as alternatives to the embodiments of FIGS. 2 and 3, it is possible to configure the implantation mask RES2, RES3 so as to produce decoy devices against reverse engineering.

Specifically, the implantation mask RES2 may possibly be configured to define the effective channel length Leff1 of a third transistor Xtor1 to be short enough, potentially zero, so that the third transistor Xtor1 is always on.

Of course, the term "always on" should be understood to mean that the third transistor is always on, or at least exhibits behavior that is akin to being always on, in the conditions of use for which the third transistor Xtor1 is normally intended (for example, conducting current between source to drain; in a transistor on state).

Conversely, the implantation mask RES3 may possibly be configured to define the effective channel length Leff2 of a fourth transistor Xtor2 to be long enough that the fourth transistor is always off.

Similarly, the term "always off" should be understood to mean that the transistor is always off, or at least exhibits behavior that is akin to being always off, in the conditions of use for which the fourth transistor Xtor2 is normally intended (for example, blocking the conduction of current between source to drain; in a transistor off state).

In the case of the fourth transistor Xtor2, it is advantageous for the effective channel region Leff2, defined between the two lightly doped drain regions LDD, to be covered and hidden by a structure. Thus, it is advantageous to define the effective channel length Leff2 of the fourth transistor Xtor2 such that it is delimited below spacer regions that are conventionally provided on the flanks (not shown) of the gate region.

Thus, always-on or always-off transistors, for example incorporated within a logic-gate embodiment, may function as a decoy against reverse engineering by disrupting functional analysis of the circuit.

The undesirable scatter for which compensation is needed may result from variation that is intrinsic to the fabrication process.

For example, there is scatter in the characteristics of transistors that are produced on one and the same semiconductor wafer that is dependent on the location of the transistor on the wafer. Specifically, the characteristics of transistors that are fabricated in regions radially towards the outside of a wafer vary with respect to the features of transistors that are fabricated in the center region of a wafer.

Thus, in the process described above with reference to FIGS. 1A-1C, 2 and 3, the operation of forming the implantation mask may be configured to define the effective channel length Leff of the MOSFETs on the wafer so as to compensate for the variation in the characteristics of the MOSFETs that is correlated with the position of each MOSFET on the wafer.

Another example of scatter in the characteristics of transistors results from parasitic edge effects for transistors where an edge of the channel region makes contact with a lateral isolating region. Lateral isolating regions, which are conventional and known, are nearly always present in integrated circuits, following shallow-trench-isolation techniques.

Basically, parasitic edge effects are due to a change in the concentration of the dopants in the channel region caused by the dopants migrating towards the lateral isolating region.

Similarly, the operation of forming the implantation mask may be configured to define the effective channel length Leff of transistors in the vicinity of lateral isolating regions so as to compensate for a variation in its characteristics due to parasitic edge effects with the lateral isolating region.

Figure 6:
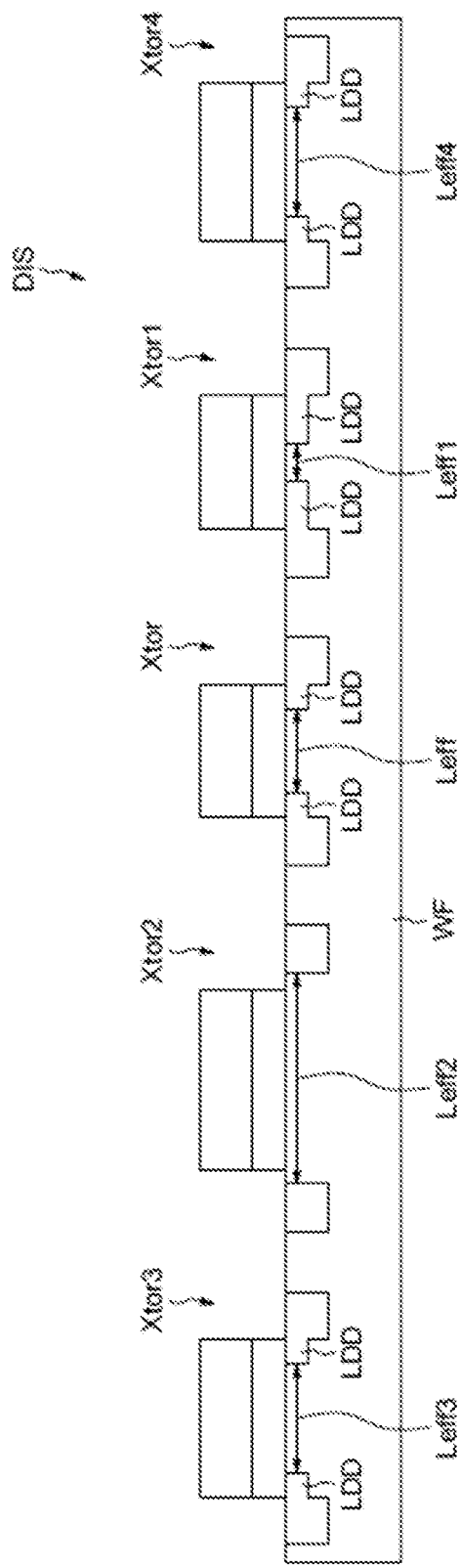
FIG. 6 shows an exemplary semiconductor device DIS including various embodiments of transistors that were obtained, respectively, according to implementations described above with reference to FIGS. 1A-1C, 2 and 3.

FIG. 6 shows an exemplary semiconductor device DIS including various embodiments of transistors that were obtained, respectively, according to implementations described above with reference to FIGS. 1 to 3.

For example, the semiconductor device DIS is a silicon wafer WF on which a plurality of integrated-circuit chips are fabricated, but the device DIS could also just be a single integrated-circuit chip.

The semiconductor device DIS includes a transistor Xtor, referred to as a reference transistor with a reference channel length Leff, which is obtained by means of the process described above with reference to FIGS. 1A-1C.

The reference channel length Leff corresponds, for example, to the effective channel length obtained on the basis of the physical gate length such as described above with reference to FIGS. 1A-1C.

The semiconductor device DIS includes a first transistor Xtor1 with a first effective channel length Leff1 that is shorter than the length of the reference channel Leff.

For example, the first effective channel length Leff1 may be short enough that the transistor Xtor1 is manufactured so as to be always on.

The first transistor Xtor1 is, for example, obtained using the process described above with reference to FIG. 2.

The semiconductor device DIS includes a second transistor Xtor2 with a second effective channel length Leff2 that is longer than the length of the reference channel Leff.

For example, the second effective channel length Leff2 may be long enough that the transistor Xtor2 is always off.

The second transistor Xtor2 is, for example, obtained using the process described above with reference to FIG. 3.

The semiconductor device DIS includes a third transistor Xtor3, with a third channel length Leff3 that is configured to compensate for a variation in its characteristics due to parasitic edge effects with a lateral isolating region in its vicinity (not visible in the plane of FIG. 6).

For example, the third effective channel length Leff3 is configured such that the third transistor Xtor3 exhibits the same effective characteristics as the reference transistor Xtor despite the presence of the lateral isolating region in its vicinity.

The third transistor Xtor3 is for example obtained by means of the process such as described above with reference to FIGS. 1A-1C, 2 and 3.

The semiconductor device DIS includes a fourth transistor Xtor4, with a fourth effective channel length Leff4 that is configured to compensate for the variation in the characteristics of the fourth transistor Xtor4 that is correlated with the position of the transistor on the wafer WF.

For example, the fourth effective channel length Leff4 is configured such that the fourth transistor Xtor4 exhibits the same effective characteristics as the reference transistor Xtor despite the different positions of the reference transistor Xtor and of the fourth transistor Xtor4 on the wafer WF.

The fourth transistor Xtor4 is for example obtained by means of the process such as described above with reference to FIGS. 1A-1C, 2 and 3.

The semiconductor device DIS has the advantage of including numerous effective channel length configurations Leff, Leff1, Leff2, Leff3, Leff4 for transistors of the same kind (i.e. with the same physical gate length), the effective channel lengths having been chosen specifically for each MOSFET embodiment and at lower cost.

Thus, the characteristics of the MOSFETs could be adjusted optimally for each transistor, and integrated circuits provided with chips from such a wafer WF will themselves also be optimized for the applications for which they are intended.

Furthermore, integrated circuits provided with chips from such a wafer WF will be able to exhibit improved uniformity in their behavior, since undesirable scatter resulting from variation in the fabrication process has been compensated for.

The invention claimed is:

1. A process for fabricating metal-oxide-semiconductor field-effect transistors (MOSFETs), comprising:
for each of a first MOSFET and a second MOSFET:
implanting lightly doped regions on either side of a site for a future gate region; and
forming a gate region with a physical gate length that is associated with a reference channel length;
wherein implanting is carried out before forming;
wherein implanting comprises forming an implantation mask defining the lightly doped regions and an effective channel length for each of the first MOSFET and second MOSFET, wherein forming the implantation mask is configured to define the effective channel length for each of the first MOSFET and second MOSFET that is different from the respective reference channel length;
wherein forming the gate region comprises forming the physical gate lengths of said first MOSFET and said second MOSFET to be equal; and
wherein implanting comprises defining with the implantation mask the effective channel lengths of said first MOSFET and said second MOSFET to be different.

2. The process according to claim 1, wherein forming the implantation mask is configured to define the effective channel length of the second MOSFET to be shorter than the respective reference channel length.

3. The process according to claim 1, wherein forming the implantation mask is configured to define the effective channel length of the first MOSFET to be longer than the respective reference channel length.

4. The process according to claim 2, wherein the operation of forming the implantation mask is configured to define the effective channel length of the first MOSFET to be short enough that the first MOSFET is always on.

5. The process according to claim 4, wherein the effective channel length is defined to be zero.

6. The process according to claim 3, wherein the operation of forming the implantation mask is configured to define the effective channel length of the second MOSFET to be long enough that the second MOSFET is always off.

7. The process according to claim 6, further comprising forming dielectric spacer regions on flanks of the gate region, and wherein forming the implantation mask is configured to define the effective channel length of said second MOSFET to be delimited to below the spacer regions.

8. The process according to claim 1, further comprising forming at least one lateral isolating region in contact with the channel region one of the first and second MOSFET, and wherein forming the implantation mask is configured to define the effective channel length of said one of the first and second MOSFET so as to compensate for a variation in transistor characteristics due to parasitic edge effects with the lateral isolating region.

9. The process according to claim 1, wherein said MOSFET is fabricated on a semiconductor wafer, and wherein forming the implantation mask is configured to define the effective channel length one of the first and second MOSFET so as to compensate for a variation in transistor characteristics that is correlated with the position of said one of the first and second MOSFET on the wafer.

10. The process according to claim 1, wherein the implantation mask is formed using resist and photolithography.

11. The process according to claim 1, wherein the implantation mask is a hardmask.

12. A process for fabricating metal-oxide-semiconductor field-effect transistors (MOSFETs), comprising:
implanting lightly doped regions on either side of a first gate site for a first MOSFET and on either side of a second gate site for a second MOSFET;
wherein implanting comprises forming an implantation mask defining locations for the lightly doped regions and defining a first effective channel length of the first MOSFET and a second effective channel length of the second MOSFET;
then forming a first gate having a first physical gate length at the first gate site for the first MOSFET and forming a second gate having a second physical gate length at the second gate site for the second MOSFET;
wherein the first and second physical gate lengths are equal; and
wherein the first and second effective channel lengths are different.

13. The process according to claim 12, wherein the first physical gate length is associated with a reference channel length, and wherein the first effective channel length is shorter than the reference channel length.

14. The process according to claim 13, wherein forming the implantation mask is configured to define the first effective channel length to be short enough so that the first MOSFET is in always on operating state.

15. The process according to claim 14, wherein the first effective channel length is zero.

16. The process according to claim 12, wherein the second physical gate length is associated with a reference channel length, and wherein the second effective channel length is longer than the reference channel length.

17. The process according to claim 16, wherein forming the implantation mask is configured to define the second effective channel length to be long enough so that the second MOSFET is in an always off operating state.

18. The process according to claim 12, further comprising forming dielectric spacer regions on flanks of each of the first and second gates, and wherein forming the implantation mask is configured to define the first and second effective channel lengths to be delimited to below the dielectric spacer regions.

19. The process according to claim 12, wherein the implantation mask is formed using resist and photolithography.

20. The process according to claim 12, wherein the implantation mask is a hardmask.

* * * * *

UNITED STATES PATENT AND TRADEMARK OFFICE
CERTIFICATE OF CORRECTION

PATENT NO. : 11,424,342 B2
APPLICATION NO. : 16/939767
DATED : August 23, 2022
INVENTOR(S) : Julien Delalleau et al.

It is certified that error appears in the above-identified patent and that said Letters Patent is hereby corrected as shown below:

On the Title Page

The foreign priority information is missing and should be added:
-- (30) Foreign Application Priority Data
July 31, 2019  (FR) ....................... 1908778 --

Signed and Sealed this
Twenty-seventh Day of September, 2022

Katherine Kelly Vidal
*Director of the United States Patent and Trademark Office*